(12) United States Patent
Gerber et al.

(10) Patent No.: US 6,916,682 B2
(45) Date of Patent: Jul. 12, 2005

(54) SEMICONDUCTOR PACKAGE DEVICE FOR USE WITH MULTIPLE INTEGRATED CIRCUITS IN A STACKED CONFIGURATION AND METHOD OF FORMATION AND TESTING

(75) Inventors: Mark A. Gerber, Austin, TX (US); Shawn M. O'Connor, Austin, TX (US); Trent A. Thompson, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/008,800

(22) Filed: Nov. 8, 2001

(65) Prior Publication Data

US 2003/0085463 A1 May 8, 2003

(51) Int. Cl.[7] ........................ H01L 21/44; H01L 21/48; H01L 21/50
(52) U.S. Cl. ...................... 438/106; 438/109; 438/125; 438/126; 438/127
(58) Field of Search .................. 438/106, 125–127, 438/107, 109, 118

(56) References Cited

U.S. PATENT DOCUMENTS

| | | | | |
|---|---|---|---|---|
| 4,264,917 A | * | 4/1981 | Ugon | 257/668 |
| 4,729,061 A | * | 3/1988 | Brown | 361/719 |
| 4,850,105 A | | 7/1989 | Nakajima | |
| 5,036,024 A | * | 7/1991 | Mine et al. | 29/827 |
| 5,172,303 A | * | 12/1992 | Bernardoni et al. | 361/744 |
| 5,219,795 A | * | 6/1993 | Kumai et al. | 29/841 |
| 5,239,198 A | * | 8/1993 | Lin et al. | 257/693 |
| 5,273,938 A | * | 12/1993 | Lin et al. | 438/107 |
| 5,291,062 A | * | 3/1994 | Higgins, III | 257/698 |
| 5,376,588 A | | 12/1994 | Pendse | |
| 5,383,269 A | * | 1/1995 | Rathmell et al. | 29/830 |
| 5,795,799 A | * | 8/1998 | Hosoya | 438/126 |
| 5,798,564 A | * | 8/1998 | Eng et al. | 257/686 |
| 5,804,467 A | | 9/1998 | Kawahara | |
| 5,815,372 A | * | 9/1998 | Gallas | 361/760 |
| 5,843,808 A | | 12/1998 | Karnezos | |
| 5,963,429 A | * | 10/1999 | Chen | 361/764 |

(Continued)

FOREIGN PATENT DOCUMENTS

| | | |
|---|---|---|
| GB | 2287123 A | 9/1995 |
| JP | 2000269409 | 9/2000 |
| WO | WO96/41378 | 12/1996 |

OTHER PUBLICATIONS

International Search Report.

*Primary Examiner*—Michael Lebentritt
*Assistant Examiner*—Angel Roman
(74) *Attorney, Agent, or Firm*—Susan C. Hill; Kim-Marie Vo

(57) ABSTRACT

A package device (10, 100) has one integrated circuit (22, 122) in a cavity (20, 120) in a package substrate (12, 122) and electrically coupled to one side (50, 150) of the package substrate. A second integrated circuit (32, 132) is mounted on another side of the package device and electrically coupled to that side as well. A third integrated circuit (38, 138) or more may be mounted on the second integrated circuit. Pads (16, 116, 116) useful for testing are present on both sides of the package substrate. The integrated circuits may be tested before final encapsulation to reduce the risk of providing completed packages with non-functional integrated circuits therein.

22 Claims, 10 Drawing Sheets

U.S. PATENT DOCUMENTS

| | | | |
|---|---|---|---|
| 5,973,392 A | 10/1999 | Senba | |
| 5,994,166 A * | 11/1999 | Akram et al. | 438/108 |
| 5,998,864 A | 12/1999 | Khandros | |
| 6,022,759 A * | 2/2000 | Seki et al. | 438/123 |
| 6,023,098 A | 2/2000 | Higashiguchi et al. | |
| 6,117,704 A * | 9/2000 | Yamaguchi et al. | 438/100 |
| 6,133,067 A * | 10/2000 | Jeng et al. | 438/110 |
| 6,133,629 A | 10/2000 | Han | |
| 6,153,928 A * | 11/2000 | Cho | 257/686 |
| 6,157,080 A | 12/2000 | Tamaki et al. | |
| 6,181,002 B1 | 1/2001 | Juso et al. | |
| 6,184,463 B1 * | 2/2001 | Panchou et al. | 174/52.4 |
| 6,201,302 B1 | 3/2001 | Tzu | |
| 6,214,641 B1 * | 4/2001 | Akram | 438/107 |
| 6,239,496 B1 * | 5/2001 | Asada | 257/777 |
| 6,256,206 B1 * | 7/2001 | Van Campenhout | 361/760 |
| 6,291,892 B1 * | 9/2001 | Yamaguchi | 257/778 |
| 6,329,713 B1 * | 12/2001 | Farquhar et al. | 257/712 |
| 6,333,566 B1 * | 12/2001 | Nakamura | 257/790 |
| 6,344,687 B1 * | 2/2002 | Huang et al. | 257/724 |
| 6,365,963 B1 * | 4/2002 | Shimada | 257/686 |
| 6,424,050 B1 * | 7/2002 | Komiyama | 257/777 |
| 6,469,376 B2 * | 10/2002 | Vaiyapuri | 257/686 |
| 6,472,732 B1 * | 10/2002 | Terui | 257/678 |
| 6,515,356 B1 * | 2/2003 | Shin et al. | 257/678 |
| 6,798,049 B1 * | 9/2004 | Shin et al. | 257/678 |
| 2001/0006252 A1 | 7/2001 | Kim | |
| 2002/0142513 A1 * | 10/2002 | Fee et al. | 438/106 |
| 2003/0047798 A1 * | 3/2003 | Halahan | 257/685 |

\* cited by examiner

US 6,916,682 B2

SEMICONDUCTOR PACKAGE DEVICE FOR USE WITH MULTIPLE INTEGRATED CIRCUITS IN A STACKED CONFIGURATION AND METHOD OF FORMATION AND TESTING

FIELD OF THE INVENTION

The invention relates generally to a semiconductor package device and more particularly to a method of forming and testing a semiconductor package device.

BACKGROUND

In packaging integrated circuits, it has become more necessary to provide packages which allow for multiple die within the package. Testing such multiple die packages has become more difficult as the complexity of the die has increased. Also, for some multi-chip packages, it is important to electrically shield one or more of the die in the multi-chip package from one or more remaining die in the multi-chip package. It is also desirable to allow rework to be performed during the manufacturing process of forming a multi-chip package. It is also desirable to have a lower profile multi-chip package due to the limitations of the current circuit board technology.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention.

DETAILED DESCRIPTION

The stacking of a plurality of die using a cavity in a substrate to receive at least one of the plurality of die allows a lower profile package device to be used. In addition, pads used for testing purposes may be located on more than one side of the package device. Also, layers between a plurality of die may be used to provide electrical shielding between selected die. The invention is better understood by turning to the figures.

Figure 1:
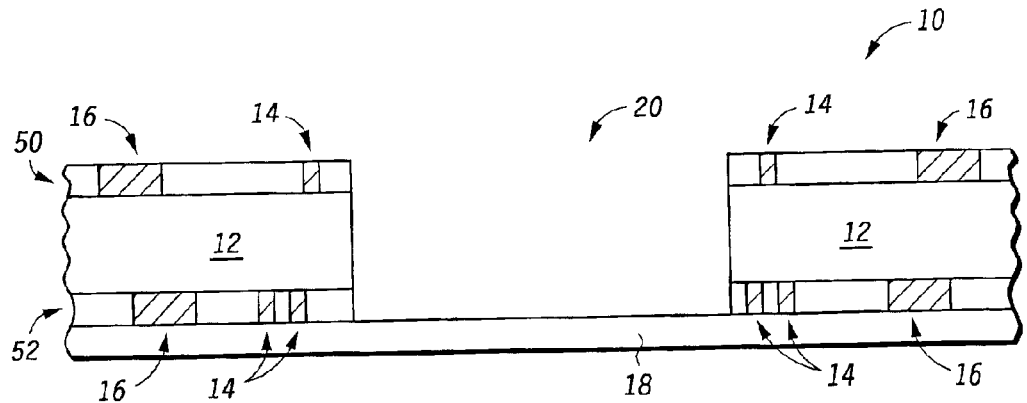
FIGS. 1–12 include illustrations of sequential cross-sectional views of a package device formed in accordance with a one embodiment of the present invention.

FIG. 1 illustrates a package device 10 having a cavity 20 in accordance with one embodiment of the present invention. Package device 10 includes a package substrate 12 having a surface 50 and a surface 52. Note that surface 50 constitutes a first plane and that surface 52 constitutes a second plane. At the top, substrate 12 includes one or more bond fingers 14 and one or more pads 16. In one embodiment of the present invention, pads 16 are conductive and may be used for a variety of purposes. For example, pads 16 may be used to mount discrete devices, may be used to receive test probes for testing purposes, or may be used to receive conductive interconnects (e.g. solder balls). FIG. 1 illustrates a tape layer 18 which is applied to surface 52 of substrate 12. In one embodiment of the present invention, substrate 12 contains electrical conductors such as traces and vias which may be used to interconnect one or more die to external contacts (not shown).

Figure 2:
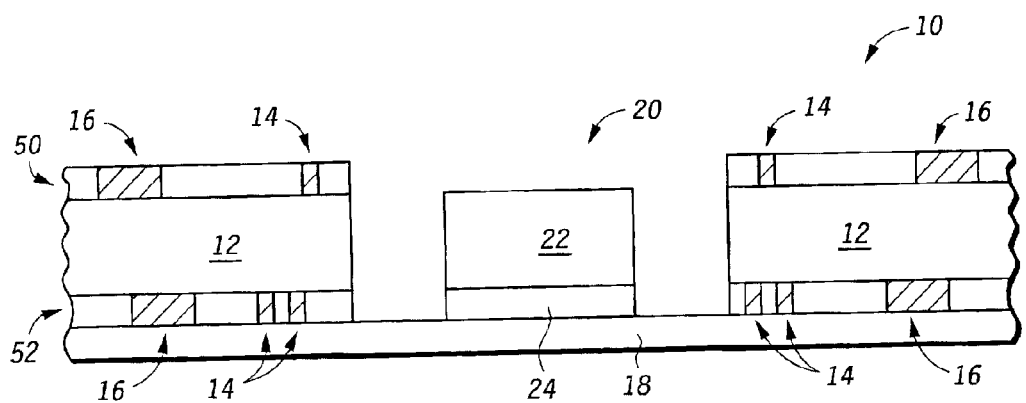

FIG. 2 illustrates one embodiment of package device 10 wherein a die attach material 24 has been placed overlying tape 18. A die 22 is then placed on top of die attach material 24. Alternate embodiments of the present invention may not use die attach material 24, but may instead directly attach die 22 to tape 18. Tape 18 is used as a supporting member to support die 22, and optionally die attach material 24. Tape 18 may or may not extend over the entire surface 52 of substrate 12.

Figure 3:
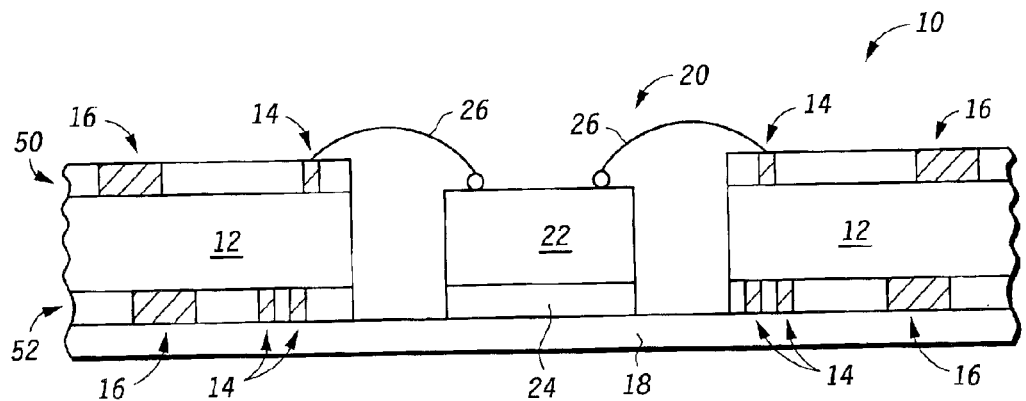

FIG. 3 illustrates one embodiment of package device 10 in which die 22 has been electrically connected to bond fingers 14 by way of wire bonds 26. Alternate embodiments of the present invention may use any number of wire bonds 26 and bond fingers 14.

Figure 4:
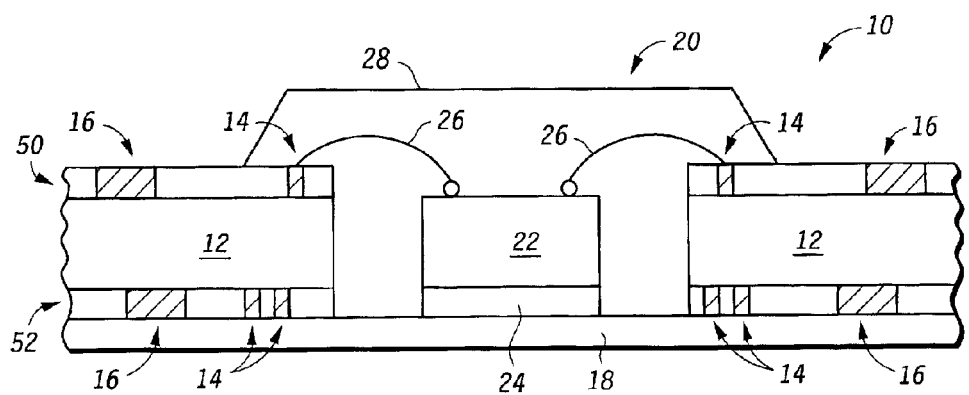

FIG. 4 illustrates one embodiment of package device 10 in which an encapsulating material 28 has been deposited over die 22, wire bonds 26, and bond fingers 14. Note that encapsulating material 28 may be any type of appropriate material for integrated circuits, such as, for example, a molded plastic or a liquid deposited glob material.

Figure 5:
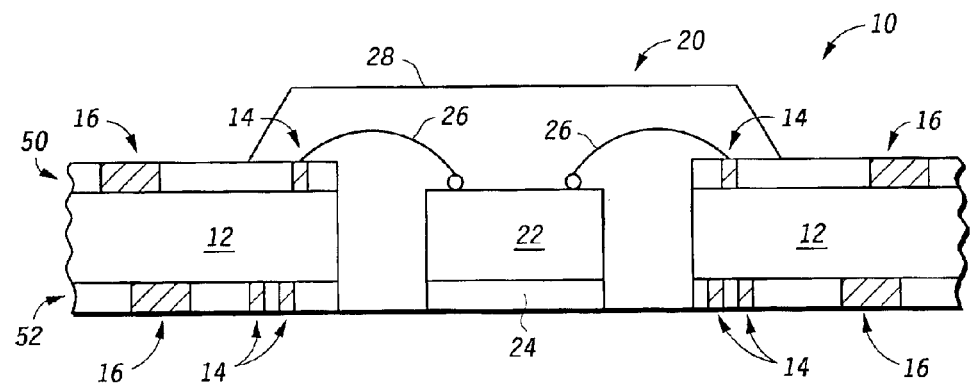

FIG. 5 illustrates one embodiment of package device 10 in which tape 18 has been removed from the bottom surface 52 of substrate 12.

Figure 6:
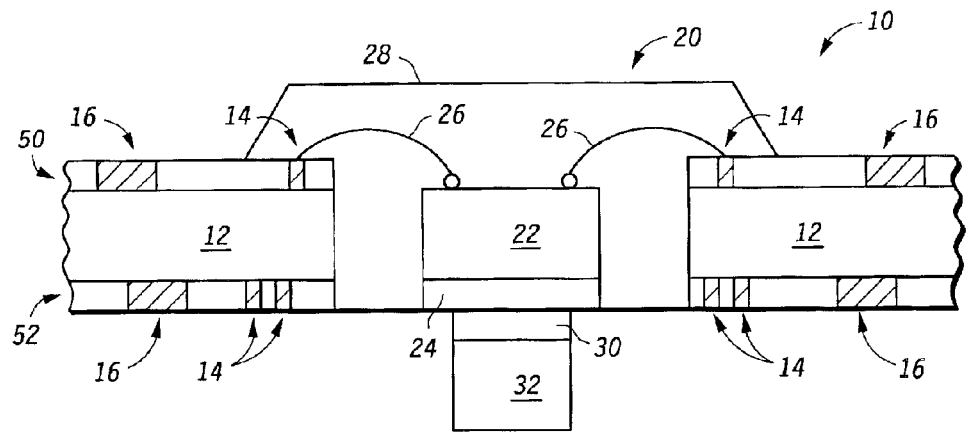

FIG. 6 illustrates one embodiment of package device 10 in which die attach material 30 is placed to attach die 32 to package device 10. In one embodiment, die attach material 30 is placed between die attach material 24 and die 32. In an alternate embodiment, when die attach material 24 is not used, die attach material 30 is placed between die 22 and die 32. Note that in one embodiment of the present invention, package device 10 may be flipped at this point in processing so that the bottom surface 52 now becomes the top surface 52 and the top surface 50 now becomes the bottom surface 50. However, alternate embodiments of the present invention may orient package device 10 in any manner during its formation. For simplicity purposes, package device 10 will be shown in the same orientation throughout the remainder of the figures.

Figure 7:
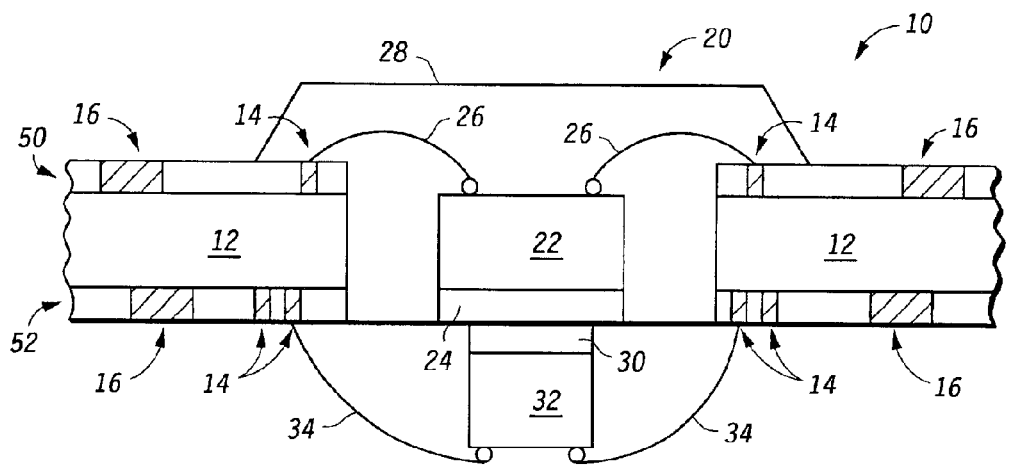

FIG. 7 illustrates one embodiment of package device 10 in which die 32 has been electrically connected to bond fingers 14 by way of wire bonds 34. Alternate embodiments of the present invention may use any number of wire bonds 34 and bond fingers 14. For embodiments of the present invention using flip chip technology, die 32 may have no wire bonds 34, but may instead be electrically connected by way of surface 52.

Figure 8:
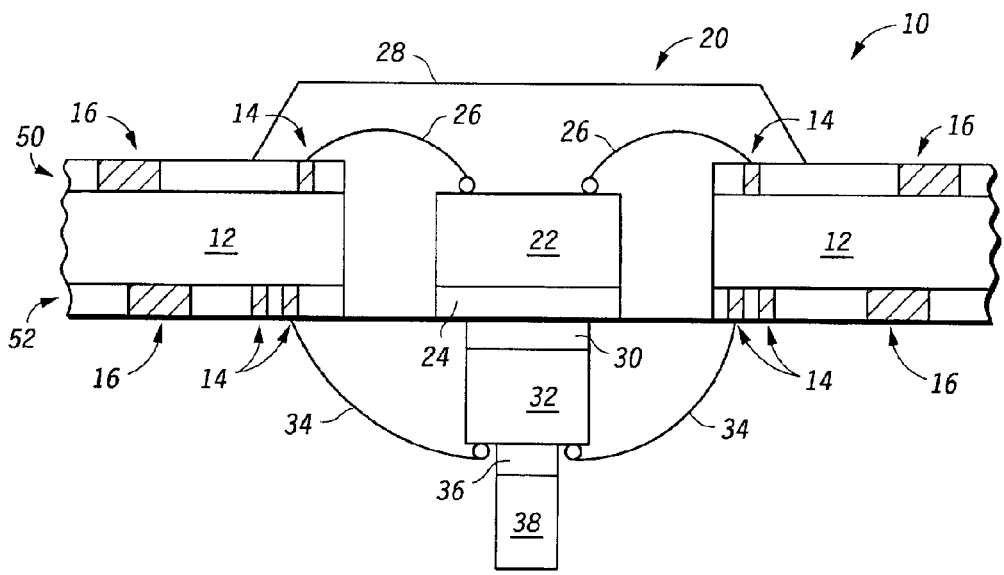

FIG. 8 illustrates one embodiment of package device 10 in which die attach material 36 is placed to attach die 38 to die 32. In one embodiment, die attach material 36 is placed between die 32 and die 38. In an alternate embodiment which uses flip chip technology, no die attach 36 is used; instead die 38 is directly electrically connected to die 32 using known flip chip techniques.

Figure 9:
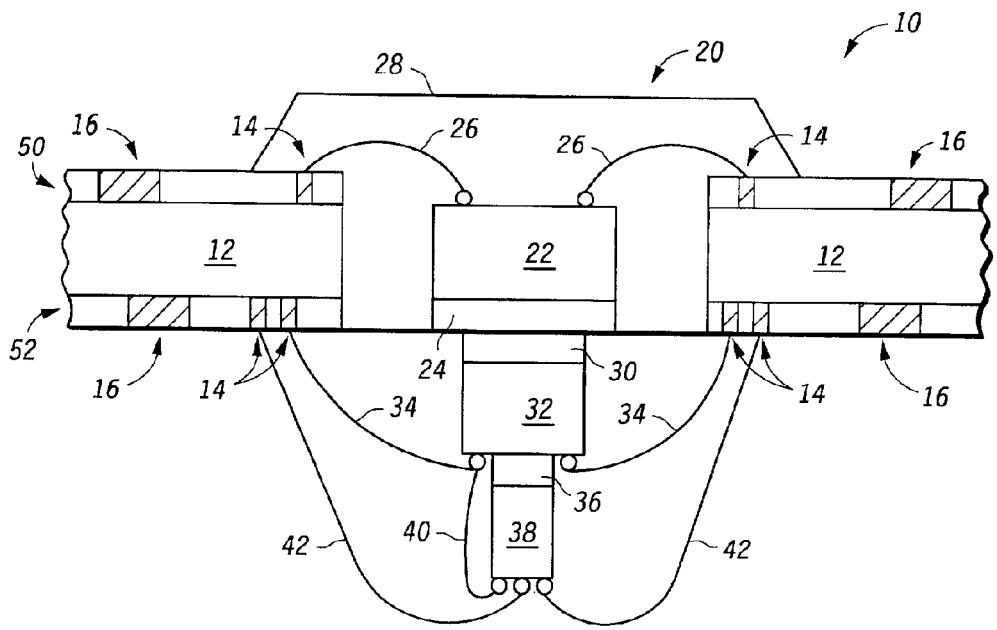

FIG. 9 illustrates one embodiment of package device 10 in which die 38 has been electrically connected to bond fingers 14 by way of wire bonds 42, and die 38 has been electrically connected to die 32 by way of wire bond 40. Alternate embodiments of the present invention may use any number of wire bonds 40 and 42, and any number of bond fingers 14. For embodiments of the present invention using flip chip technology, die 38 may have no wire bonds 42, but may instead be directly electrically connected to die 32.

Figure 10:
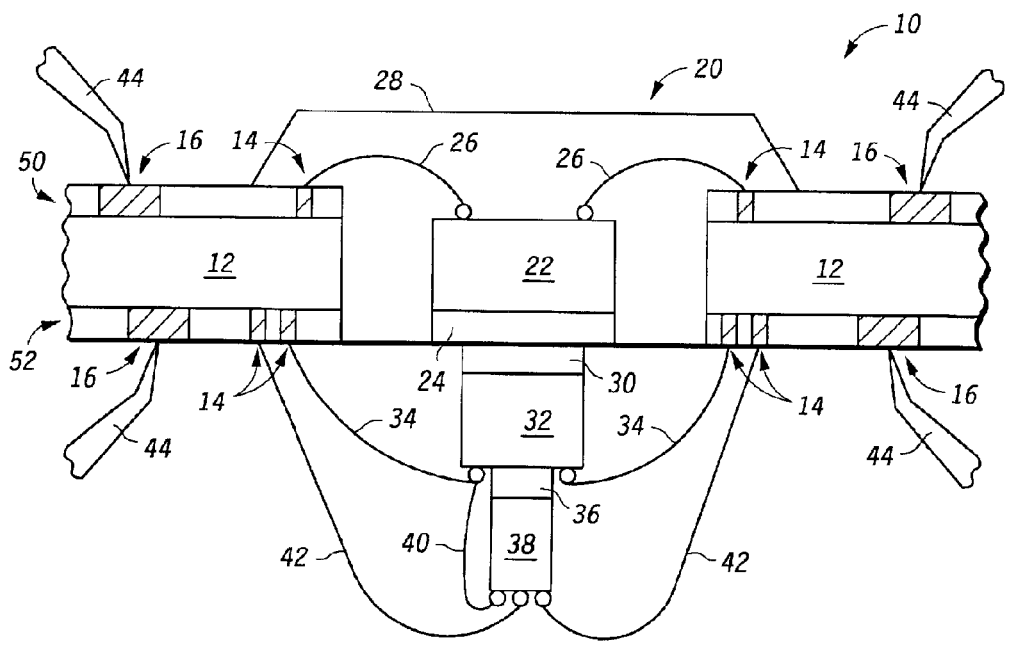

FIG. 10 illustrates one embodiment of package device 10 where test probes 44 are illustrated to show one manner in which one or more of die 22, 32, and 38 may be electrically tested. Note that in alternate embodiments of the present invention, test probes 44 may use one or more pads 16 located on just the top surface 50 of substrate 12, just the bottom surface 52 of substrate 12, or alternately on both the top and bottom surfaces 50, 52 of substrate 12. Note that in some embodiments of the present invention, there may be a significant advantage to allowing test probes 44 to access both the top surface 50 and bottom surface 52 of substrate 12. For example, this may allow more pads 16 to be accessed by test probes 44, and thus allow more signals to be use during the testing process. Also, allowing test probes 44 access to both the top and bottom surfaces 50, 52 of substrate 12 may allow easier access to each individual die 22, 32, and 38. Note that when multiple die are used within a package, the number of pads 16 required for test may be significantly higher.

Figure 11:
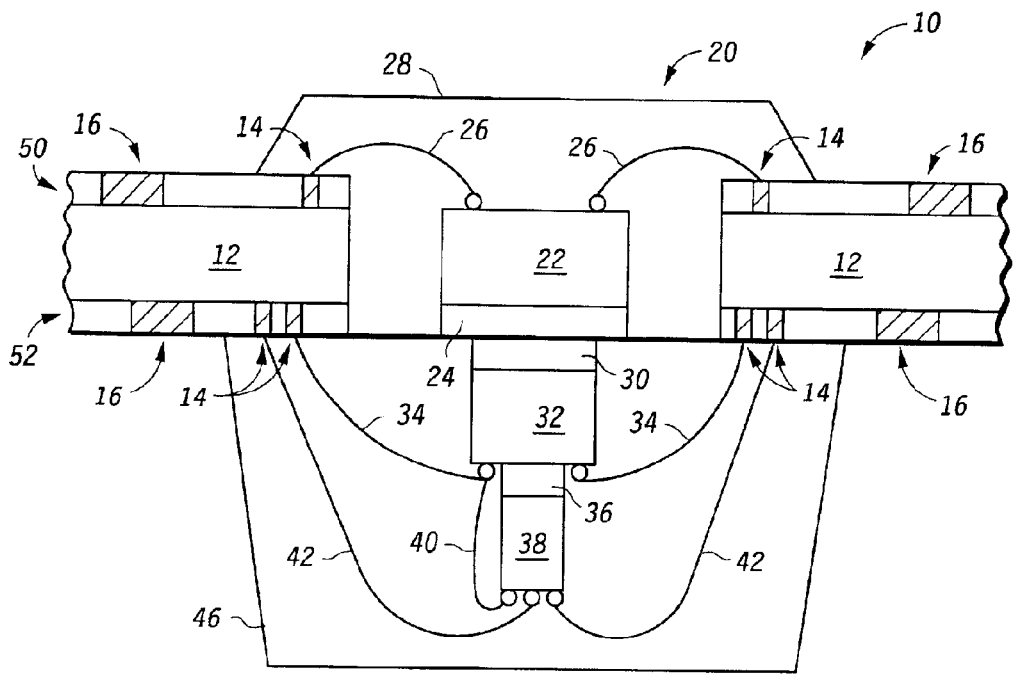

FIG. 11 illustrates one embodiment of package device 10 wherein an encapsulation material 46 has been deposited overlying die 38, die 32, and bond fingers 14. Note that in alternate embodiments of the present invention, encapsulating material 46 may be deposited over a larger portion of substrate 12. For example, in some embodiments of the present invention, encapsulating material 46 may be deposited overlying pads 16 as well. Regardless of whether pads 16 are encapsulated by encapsulating material 46, pads 16 may be used to electrically couple discrete devices to one or more of die 22, 32, and 38. Note that encapsulating material 46 may be any type of appropriate material for integrated circuits, such as, for example, a molded plastic or a liquid deposited glob material.

Figure 12:
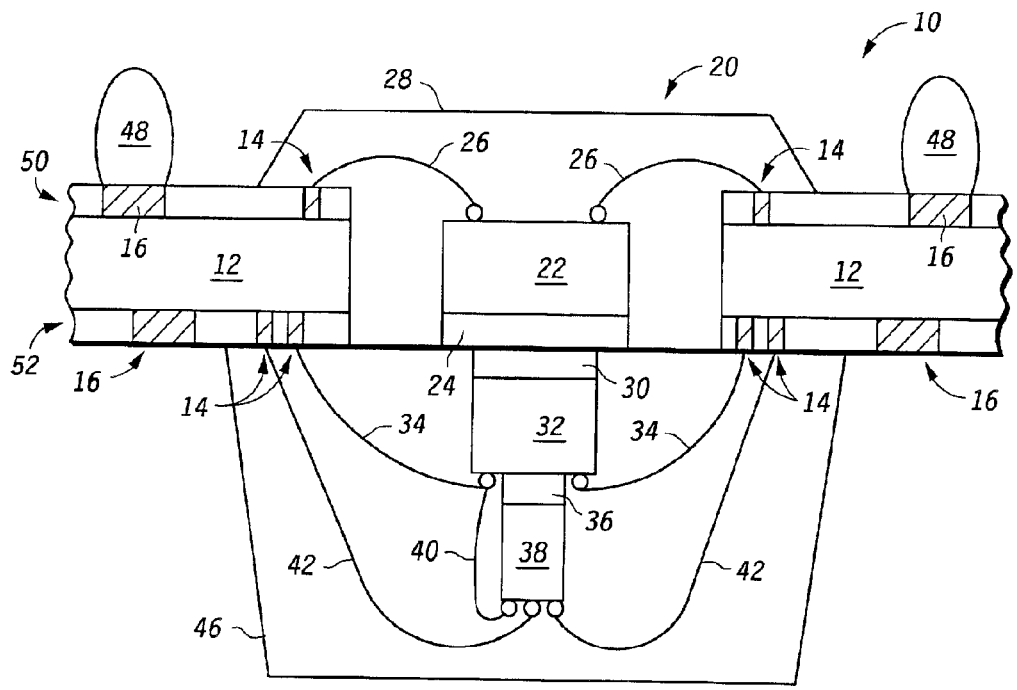

FIG. 12 illustrates one embodiment of package device 10 in which conductive interconnects 48 have been placed overlying pads 16 at surface 50. In one embodiment of the present invention conductive interconnects 48 may be solder balls. However, in alternative embodiments of the present invention, conductive interconnect 48 may be any type of electrically conductive material formed in any manner. Note that conductive interconnects 48 are optional. In some embodiments of the present invention, if encapsulating material 28 is flush with the top surface 50 of substrate 12, then conductive interconnects 48 may not be required and electrical connections can be made directly to pads 16 on surface 50 of substrate 12. Note again that traces and vias (not shown) within substrate 12 are used to selectively interconnect various portions of substrate 12. Note also that die attach materials 24, 30, and 36 may be any type of appropriate material, such as, for example, adhesive tape or non-solid adhesive (e.g. glue, epoxy). Die 22, 32, and 38 may be any type of integrated circuit, semiconductor device, or other type of electrically active substrate. Alternate embodiments of the present invention may have any number of die 22, 32, or 38 packaged within package device 10. For example, alternate embodiments may package only two die in package device 10. Note that the size and aspect ratios of die 22, 32, and may vary, and that die spacers (not shown) may be used between die. Note that die 22 is located within cavity 20 and that die 32 and die 38 are located outside of cavity 20.

Figure 13:
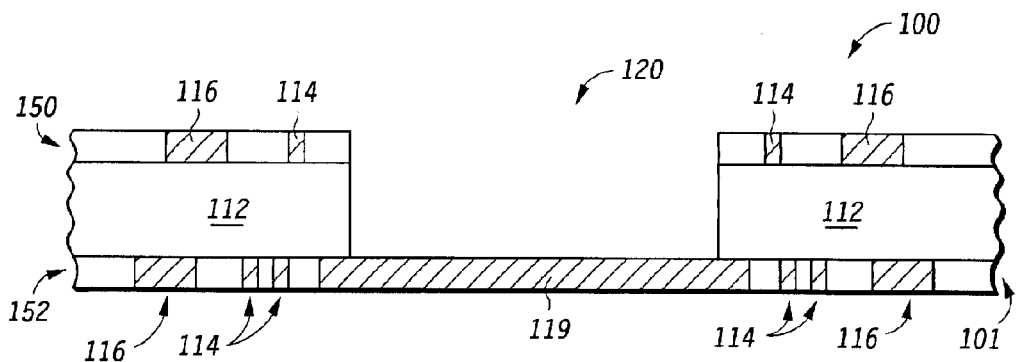
FIGS. 13–23 include illustrations of sequential cross-sectional views of a package device formed in accordance with an alternate embodiment of the present invention.

FIG. 13 illustrates a package device 100 having a cavity 120 in accordance with one embodiment of the present invention. Package device 100 includes a package substrate 112 having a surface 150 and a surface 152. Note that surface 150 constitutes a first plane and that surface 152 constitutes a second plane. At the top, substrate 112 includes one or more bond fingers 114 and one or more pads 116. In one embodiment of the present invention, pads 116 are conductive and may be used for a variety of purposes. For example, pads 116 may be used to mount discrete devices, may be used to receive test probes for testing purposes, or may be used to receive conductive interconnects (e.g. solder balls). FIG. 13 illustrates a layer 101 which is part of substrate 112 with its outer surface being surface 152. In one embodiment of the present invention, layer 101 includes supporting member 119, one or more bond fingers 114, and one or more pads 116. Alternate embodiments of the present invention may not require bond fingers 114 (e.g. when flip chip technology is used) and may not require pads 116 when an electrical connection to surface 152 is not desired. In one embodiment of the present invention, substrate 112 contains electrical conductors such as traces and vias which may be used to interconnect one or more die to external contacts (not shown).

Figure 14:
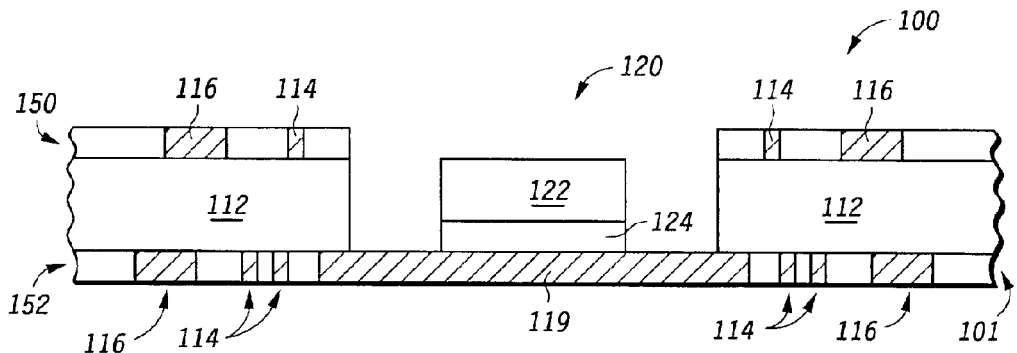

FIG. 14 illustrates one embodiment of package device 100 wherein a die attach material 124 has been placed overlying supporting member 119. A die 122 is then placed on top of die attach material 124.

Figure 15:
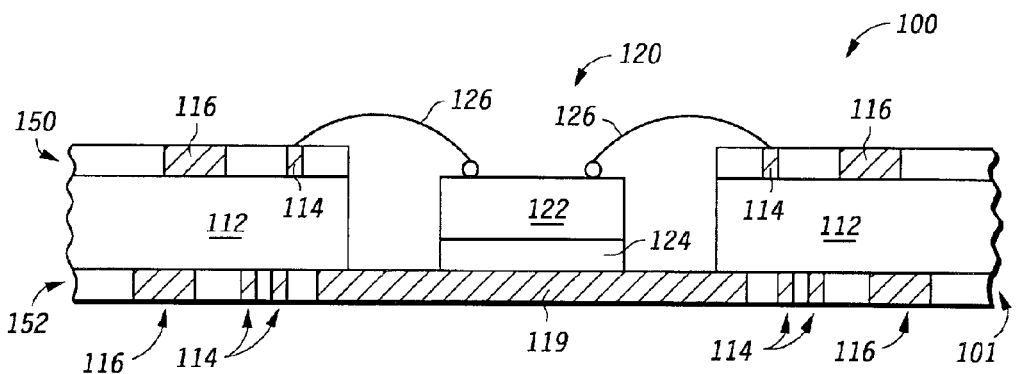

FIG. 15 illustrates one embodiment of package device 100 in which die 122 has been electrically connected to bond fingers 114 by way of wire bonds 126. Alternate embodiments of the present invention may use any number of wire bonds 126 and bond fingers 114. For embodiments of the present invention using flip chip technology, die 122 may have no wire bonds 126, but may instead be electrically connected by way of layer 101.

Figure 16:
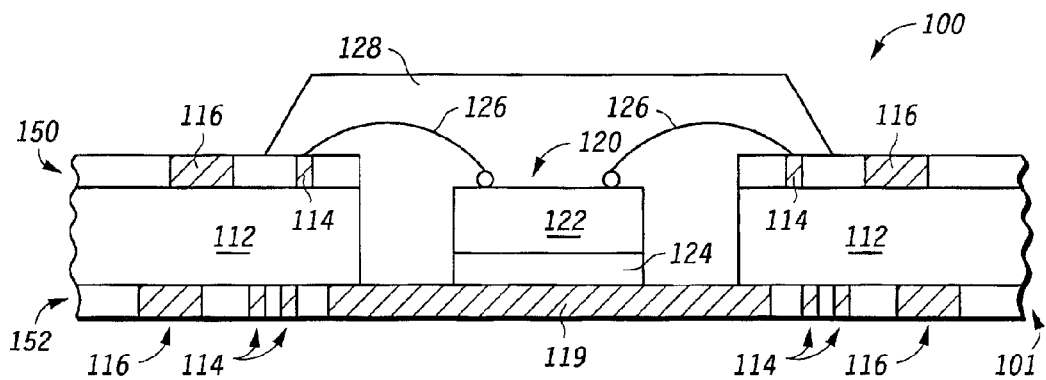

FIG. 16 illustrates one embodiment of package device 100 in which an encapsulating material 128 has been deposited over die 122, wire bonds 126, and bond fingers 114. Note that encapsulating material 128 may be any type of appropriate material for integrated circuits, such as, for example, a molded plastic or a liquid deposited glob material.

Figure 17:
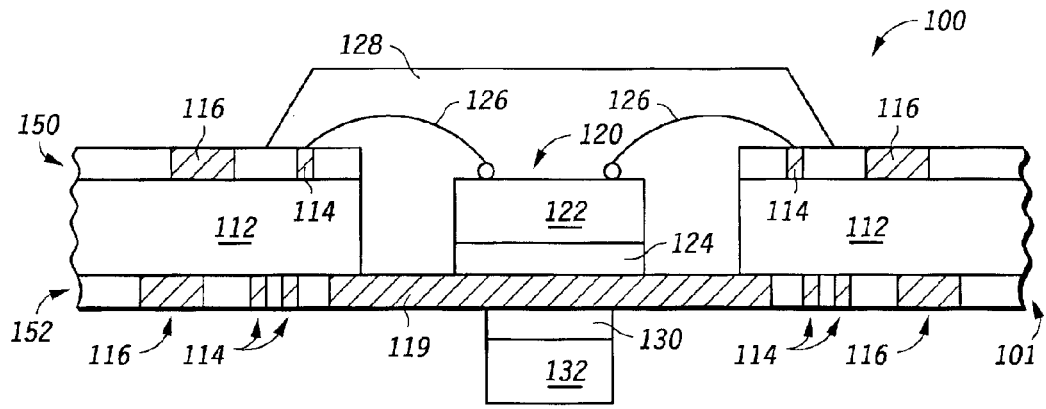

FIG. 17 illustrates one embodiment of package device 100 in which die attach material 130 is placed to attach die 132 to package device 100. In one embodiment, die attach material 130 is placed between layer 101 and die 132. Note that in one embodiment of the present invention, package device 100 may be flipped at this point in processing so that the bottom surface 152 now becomes the top surface 152 and the top surface 150 now becomes the bottom surface 150. However, alternate embodiments of the present invention may orient package device 100 in any manner during its formation. For simplicity purposes, package device 100 will be shown in the same orientation throughout the remainder of the figures.

Figure 18:
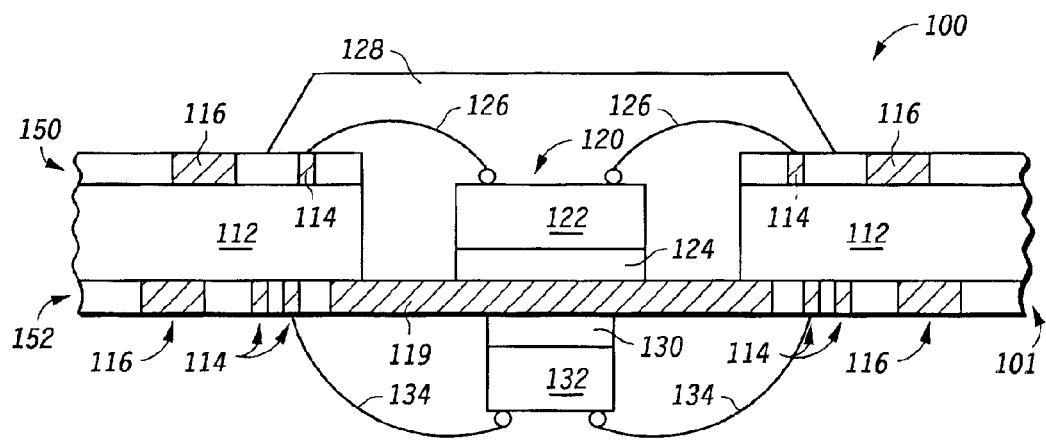

FIG. 18 illustrates one embodiment of package device 100 in which die 132 has been electrically connected to bond fingers 114 by way of wire bonds 134. Alternate embodiments of the present invention may use any number of wire bonds 134 and bond fingers 114. For embodiments of the present invention using flip chip technology, die 132 may have no wire bonds 134, but may instead be electrically connected by way of surface 152.

Figure 19:
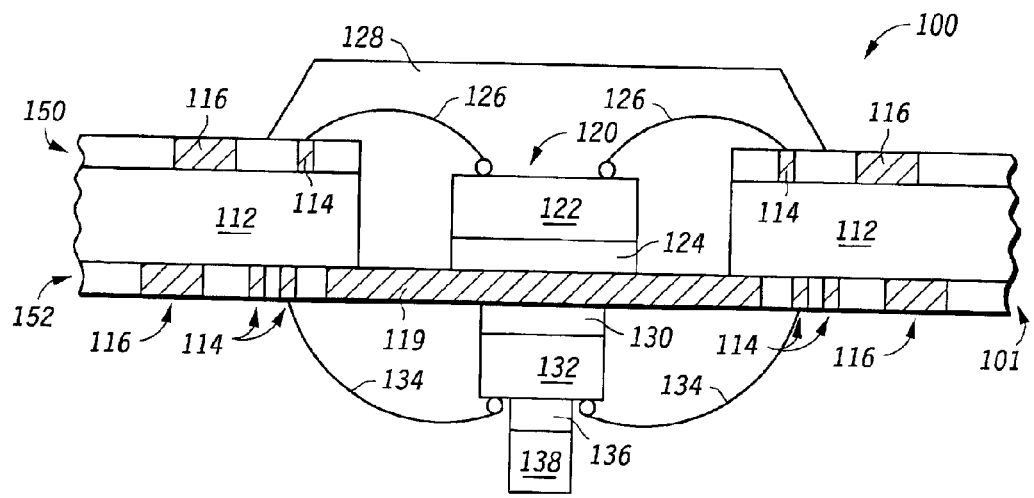

FIG. 19 illustrates one embodiment of package device 100 in which die attach material 136 is placed to attach die 138 to die 132. In one embodiment, die attach material 136 is placed between die 132 and die 138. In an alternate embodiment which uses flip chip technology, no die attach 136 is used; instead die 138 is directly electrically connected to die 132 using known flip chip techniques.

Figure 20:
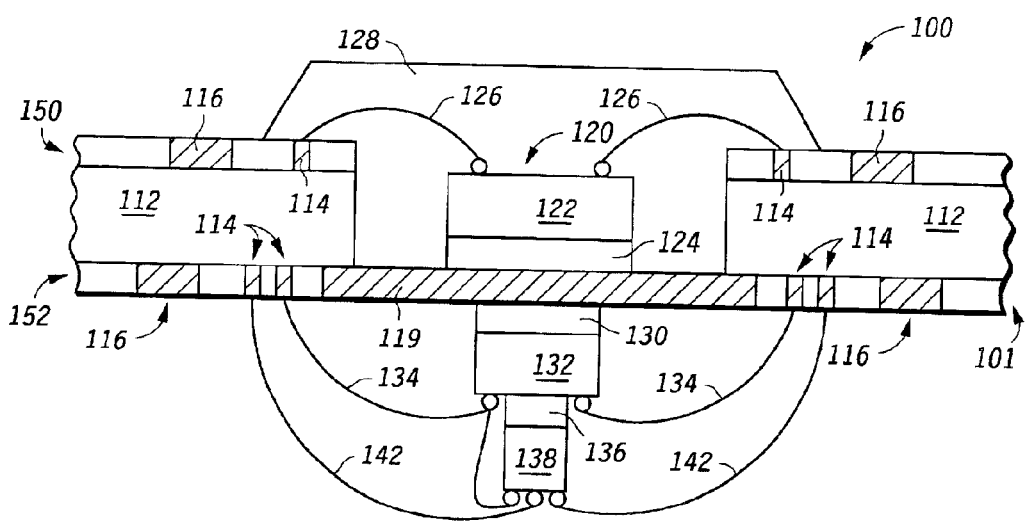

FIG. 20 illustrates one embodiment of package device 100 in which die 138 has been electrically connected to bond fingers 114 by way of wire bonds 142, and die 138 has been electrically connected to die 132 by way of wire bond 140. Alternate embodiments of the present invention may use any number of wire bonds 140 and 142, and any number of bond fingers 114. For embodiments of the present invention using flip chip technology, die 138 may have no wire bonds 142, but may instead be directly electrically connected to die 132.

Figure 21:
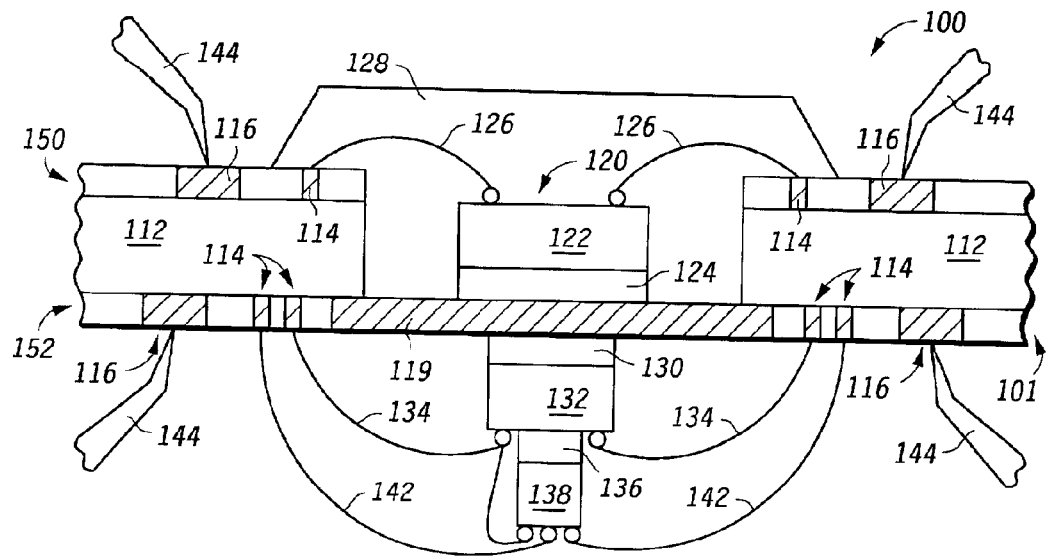

FIG. 21 illustrates one embodiment of package device 100 where test probes 144 are illustrated to show one manner in which one or more of die 122, 132, and 138 may be electrically tested. Note that in alternate embodiments of the present invention, test probes 144 may use one or more pads 116 located on just the top surface 150 of substrate 112, just the bottom surface 152 of substrate 112, or alternately on both the top and bottom surfaces 150, 152 of substrate 112. Note that in some embodiments of the present invention, there may be a significant advantage to allowing test probes 144 to access both the top surface 150 and bottom surface 152 of substrate 112. For example, this may allow more pads 116 to be accessed by test probes 144, and thus allow more signals to be use during the testing process. Also, allowing test probes 144 access to both the top and bottom surfaces 150, 152 of substrate 112 may allow easier access to each individual die 122, 132, and 138. Note that when multiple die are used within a package, the number of pads 116 required for test may be significantly higher.

Figure 22:
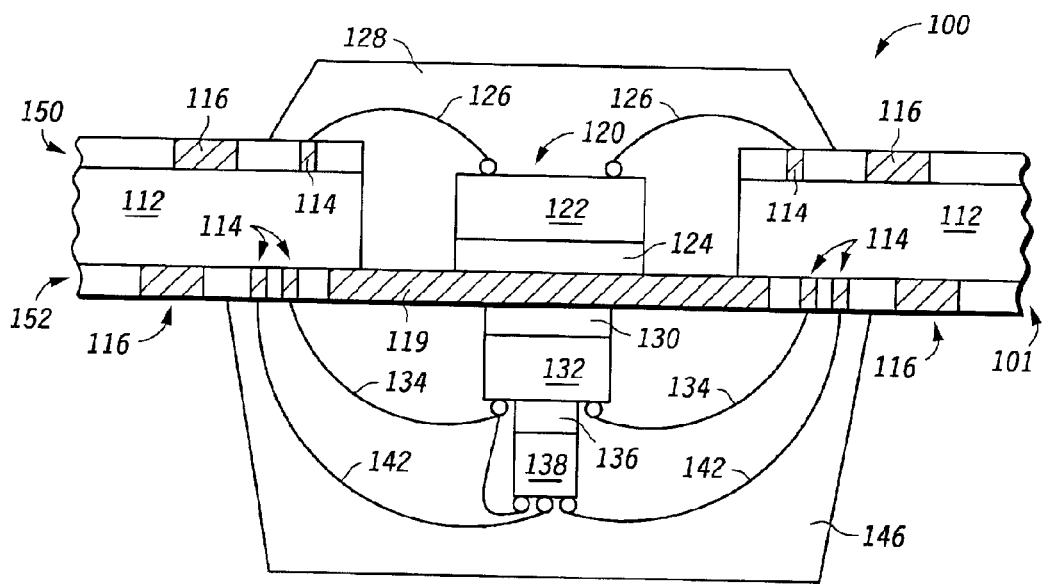

FIG. 22 illustrates one embodiment of package device 100 wherein an encapsulation material 146 has been deposited overlying die 138, die 132, and bond fingers 114. Note that in alternate embodiments of the present invention, encapsulating material 146 may be deposited over a larger portion of substrate 112. For example, in some embodiments of the present invention, encapsulating material 146 may be deposited overlying pads 116 as well. Regardless of whether pads 116 are encapsulated by encapsulating material 146, pads 116 may be used to electrically couple discrete devices to one or more of die 122, 132, and 138. Note that encapsulating material 146 may be any type of appropriate material for integrated circuits, such as, for example, a molded plastic or a liquid deposited glob material.

Figure 23:
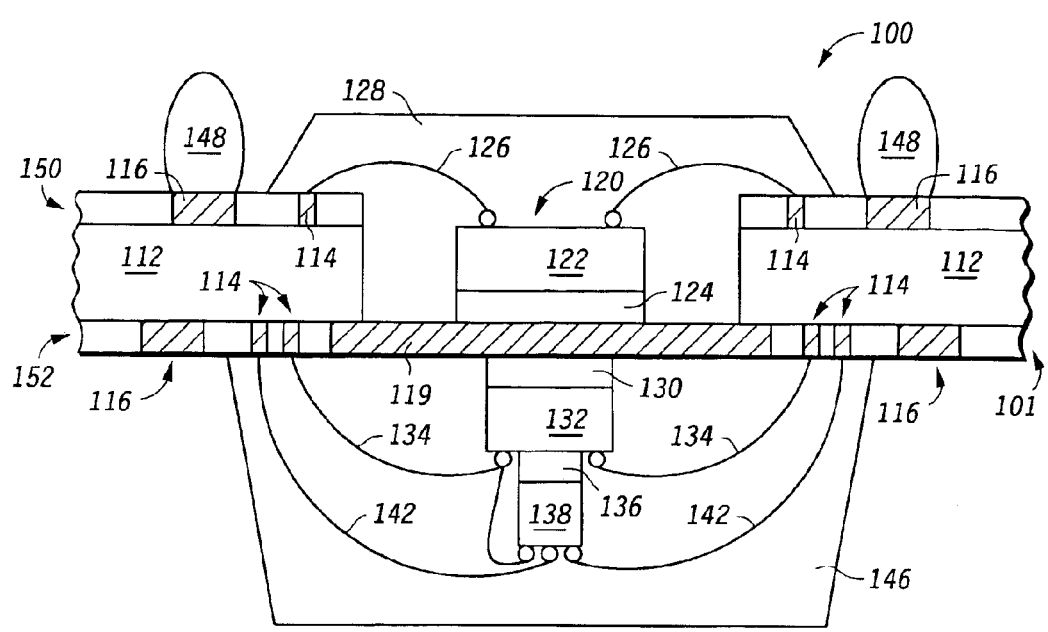

FIG. 23 illustrates one embodiment of package device 100 in which conductive interconnects 148 have been placed overlying pads 116 at surface 150. In one embodiment of the present invention conductive interconnects 148 may be solder balls. However, in alternative embodiments of the present invention, conductive interconnect 148 may be any type of electrically conductive material formed in any manner. Note that conductive interconnects 148 are optional. In some embodiments of the present invention, if encapsulating material 128 is flush with the top surface 150 of substrate 112, then conductive interconnects 148 may not be required and electrical connections can be made directly to pads 116 on surface 150 of substrate 112. Note again that traces and vias (not shown) within substrate 112 are used to selectively interconnect various portions of substrate 112. Note also that die attach materials 124, 130, and 136 may be any type of appropriate material, such as, for example, adhesive tape or non-solid adhesive (e.g. glue, epoxy). Die 122, 132, and 138 may be any type of integrated circuit, semiconductor device, or other type of electrically active substrate. Alternate embodiments of the present invention may have any number of die 122, 132, or 138 packaged within package device 100. For example, alternate embodiments may package only two die in package device 100. Note that the size and aspect ratios of die 122, 132, and 138 may vary, and that die spacers (not shown) may be used between die. Note that die 122 is located within cavity 120 and that die 132 and die 138 are located outside of cavity 120.

In the foregoing specification the invention has been described with reference to specific embodiments. However, one of ordinary skill in the art appreciates that various modifications and changes can be made without departing from the scope of the present invention as set forth in the claims below. For example, any appropriate die attach processes, wire bond processes, and tape processes may be used in the formation of package devices 10 and 100, of which there are many known in the art. Accordingly, the specification and figures are the be regarded in an illustrative rather than restrictive sense, and all such modifications are intended to be included within the scope of the present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any of the claims.

What is claimed is:

1. A method of forming a package device, comprising;
   providing a package substrate having a first side and a second side and having first pads on the first side and second pads on the second side;
   placing a first integrated circuit on the first side and a second integrated circuit on a second side, wherein die attach material is interposed between the first integrated circuit and the second integrated circuit;
   electrically connecting the first integrated circuit to the first pads and the second integrated circuit to the second pads; and
   testing the first integrated circuit and the second integrated circuit by applying test probes to the first pads and the second pads,
   wherein at least one of the first pads is electrically independent of all of the second pads, and wherein encapsulating material does not overlie at least one pad.

2. The method of claim 1, wherein the step of attaching is further characterized by:
   the first integrated circuit being placed on the first side prior to the second integrated circuit being placed on the second side.

3. The method of claim 2, wherein the step of electrically connecting is further characterized by:
   the first integrated circuit being electrically connected to the first pads prior to the second integrated circuit being electrically connected to the second pads.

4. A method for forming a package device, comprising:
   providing a package substrate having a first surface along a first plane and second surface along a second plane, wherein the package substrate has a cavity between the first plane and the second plane, and wherein the package substrate has first pads on the first surface and has second pads on the second surface;
   placing a first integrated circuit in the cavity;
   placing a second integrated circuit adjacent to the first integrated circuit outside the cavity, such that die attach material is interposed between the first integrated circuit and the second integrated circuit;
   depositing encapsulating material over the first integrated circuit and the second integrated circuit;
   electrically connecting the first integrated circuit to the first pads and the second integrated circuit to the second pads; and
   testing the first integrated circuit and the second integrated circuit by applying test probes to the first pads and the second pads, wherein at least one of the first pads is electrically independent of all of the second pads, and wherein the encapsulating material does not overlie at least one pad.

5. The method of claim 4, wherein the step of depositing comprises:

depositing a first portion of the encapsulating material over the first integrated circuit prior to the step of placing the second integrated circuit; and depositing a second portion of the encapsulating material over the second integrated circuit.

6. The method of claim 5, further comprising:

placing a third integrated circuit adjacent to the second integrated circuit prior to the step of depositing the second portion of encapsulating material.

7. The method of claim 6, wherein the third integrated circuit is stacked at least partially overlying at least one of the first and second integrated circuits.

8. The method of claim 5, wherein the step of depositing the first portion of the encapsulating material comprises transfer molding the encapsulating material, and wherein the step of depositing a second portion of the encapsulating material comprises transfer molding the encapsulating material.

9. The method of claim 4, wherein the package substrate further comprises first bond fingers on the first surface, and second bond fingers on the second surface.

10. The method of claim 9, wherein the step of electrically connecting the first integrated circuit comprises wire bonding.

11. The method of claim 4, wherein the package substrate further comprises a supporting member along the second plane of the substrate.

12. The method of claim 11, wherein the supporting member is between the first integrated circuit and the second integrated circuit.

13. The method of claim 12, wherein the supporting member is electrically conductive.

14. The method of claim 11, further comprising removing the supporting member prior to step of placing the second integrated circuit.

15. The method of claim 14, wherein supporting member is tape.

16. A method for forming a package device, comprising:

providing a package substrate having a first surface along a first plane and second surface along a second plane, wherein the package substrate has a cavity between the first plane and the second plane;

placing a first integrated circuit in the cavity;

placing a second integrated circuit adjacent to the first integrated circuit outside the cavity, such that a supporting member is interposed between the first integrated circuit and the second integrated circuit; and depositing encapsulating material over the first integrated circuit and the second integrated circuit, wherein the package substrate is not formed from encapsulating material, and wherein the step of depositing comprises:

depositing a first portion of the encapsulating material over the first integrated circuit prior to the step of placing the second integrated circuit; and depositing a second portion of the encapsulating material over the second integrated circuit, wherein the method further comprises placing a third integrated circuit adjacent to the second integrated circuit prior to the step of depositing the second portion of encapsulating material wherein the method further comprises electrically connecting the first integrated circuit to first pads, wherein the first pads are located on the first surface;

electrically connecting the second integrated circuit to second pads, wherein the second pads are located on the second surface; and testing the first integrated circuit and the second integrated circuit by applying test probes to the first pads and the second pads.

17. A method for forming a package device, comprising:

providing a package substrate having a first side and a second side;

providing first pads on the first side;

providing second pads on the second side;

providing a first integrated circuit mounted to the package substrate;

providing a second integrated circuit mounted to the package substrate; and providing a third integrated circuit adjacent to the second integrated circuit, wherein the first integrated circuit is electrically connected to the first pads and the second integrated circuit is electrically connected to the second pads.

wherein the first pads and the second pads are further characterized as being useful for receiving test probes for testing, and wherein one of the first and second pads is not covered by an encapsulating material and is exposed for receiving one of the test probes.

18. The method of claim 17, wherein the substrate is further characterized as having a cavity and the first integrated circuit is further characterized as being in the cavity.

19. The method of claim 18, wherein the second integrated circuit is mounted to the substrate by adhesive die attach tape.

20. The method of claim 19, wherein the first integrated circuit is adjacent to the second integrated circuit.

21. The method of claim 20, further comprising providing a supporting member between the first integrated circuit and the second integrated circuit.

22. The method of claim 21, wherein the supporting member comprises die attach material.

* * * * *

UNITED STATES PATENT AND TRADEMARK OFFICE
CERTIFICATE OF CORRECTION

PATENT NO. : 6,916,682 B2  Page 1 of 1
APPLICATION NO. : 10/008800
DATED : November 8, 2001
INVENTOR(S) : Mark A. Gerber It is certified that error appears in the above-identified patent and that said Letters Patent is hereby corrected as shown below:

In Column 8, Line 9, Claim No. 16:
 Change "material" to --material,--

In Column 8, Line 33, Claim No. 17:
 Change "second pads." to --second pads,--

Signed and Sealed this

Thirteenth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 6,916,682 B2  Page 1 of 1
APPLICATION NO. : 10/008800
DATED : July 12, 2005
INVENTOR(S) : Mark A. Gerber It is certified that error appears in the above-identified patent and that said Letters Patent is hereby corrected as shown below:

In Column 8, Line 9, Claim No. 16:
    Change "material" to --material,--

In Column 8, Line 33, Claim No. 17:
    Change "second pads." to --second pads,--

This certificate supersedes the Certificate of Correction issued May 13, 2008.

Signed and Sealed this

Third Day of June, 2008

JON W. DUDAS
*Director of the United States Patent and Trademark Office*